(12) United States Patent
Di Febbo et al.

(10) Patent No.: US 11,694,733 B2
(45) Date of Patent: Jul. 4, 2023

(54) ACCELERATION OF IN-MEMORY-COMPUTE ARRAYS

(71) Applicant: Apple Inc., Cupertino, CA (US)

(72) Inventors: Paolo Di Febbo, Redwood City, CA (US); Mohamed H. Abu-Rahma, Mountain View, CA (US); Jelam K. Parekh, Milpitas, CA (US); Yildiz Sinangil, Campbell, CA (US); Mohammad Ghasemzadeh, San Jose, CA (US); Anthony Ghannoum, Santa Clara, CA (US); Chaminda N. Vidanagamachchi, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 17/406,817

(22) Filed: Aug. 19, 2021

(65) Prior Publication Data

US 2023/0059200 A1 Feb. 23, 2023

(51) Int. Cl.
G11C 8/00 (2006.01)
G11C 7/22 (2006.01)
H03M 1/82 (2006.01)
G11C 7/10 (2006.01)

(52) U.S. Cl.
CPC .............. *G11C 7/222* (2013.01); *G11C 7/106* (2013.01); *G11C 7/1087* (2013.01); *H03M 1/82* (2013.01)

(58) Field of Classification Search
CPC .................................................. G11C 7/222
USPC ..................................................... 365/233.1
See application file for complete search history.

(56) References Cited

U.S. PATENT DOCUMENTS

| 6,868,009 | B1 | 3/2005 | Hung et al. |
| 9,235,414 | B2 | 1/2016 | Gopal et al. |
| 10,175,980 | B2 | 1/2019 | Temam et al. |
| 10,825,536 | B1 | 11/2020 | Yang et al. |
| 2018/0365520 | A1* | 12/2018 | Lee .................... G06N 3/0454 |

(Continued)

FOREIGN PATENT DOCUMENTS

WO 2021-158861 A1 8/2021

OTHER PUBLICATIONS

International Search Report and Written Opinion in PCT Appl. No. PCT/US2022/040221 dated Nov. 24, 2022, 10 pages.

(Continued)

*Primary Examiner* — Hoai V Ho
(74) *Attorney, Agent, or Firm* — Kowert, Hood, Munyon, Rankin & Goetzel, P.C.; Scott W. Pape; Dean M. Munyon

(57) ABSTRACT

An apparatus includes an in-memory compute circuit that includes a memory circuit configured to generate a set of products by combining received input values with respective weight values stored in rows of the memory circuit, and to combine the set of products to generate an accumulated output value. The in-memory compute circuit may further include a control circuit and a plurality of routing circuits, including a first routing circuit coupled to a first set of rows of the memory circuit. The control circuit may be configured to cause the first routing circuit to route groups of input values to different ones of the first set of rows over a plurality of clock cycles, and the memory circuit to generate, on a clock cycle following the plurality of clock cycles, a particular accumulated output value that is computed based on the routed groups of input values.

20 Claims, 11 Drawing Sheets

(56) References Cited

U.S. PATENT DOCUMENTS

| | | |
|---|---|---|
| 2019/0205740 A1 | 7/2019 | Judd et al. |
| 2020/0192971 A1 | 6/2020 | Lue et al. |
| 2020/0388330 A1 | 12/2020 | Grover et al. |
| 2022/0083845 A1* | 3/2022 | Marukame ................ G06F 7/50 |

OTHER PUBLICATIONS

Dazzi et al., "Accelerating Inference of Convolutional Neural Networks Using In-memory Computing," Frontiers in Computational Neuroscience, pp. 1-19, Aug. 3, 2021 [retrieved on Nov. 9, 2022]. Retrieved from the Internet: <URL: https://www.frontiersin.org/articles/10.3389/fncom.2021.674154/full>.

Wei et al., "Memory Access Optimization of a Neural Network Accelerator Based on Memory Controller," MDPI, Electronics 2021, vo. 10, Issue 4, pp. 1-20, Feb. 10, 2021[retrieved on Nov. 9, 2022]. Retrieved from the Internet: <URL: https://www.mdpi.com/2079-9292/10/4/438> pp. 1-20.

* cited by examiner

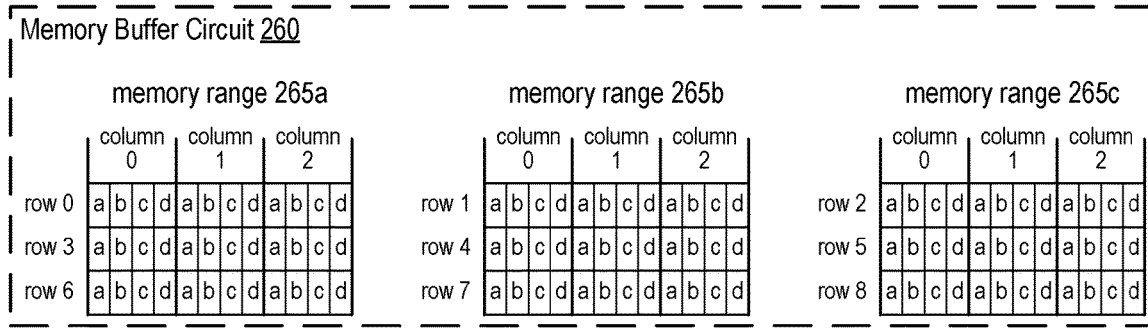
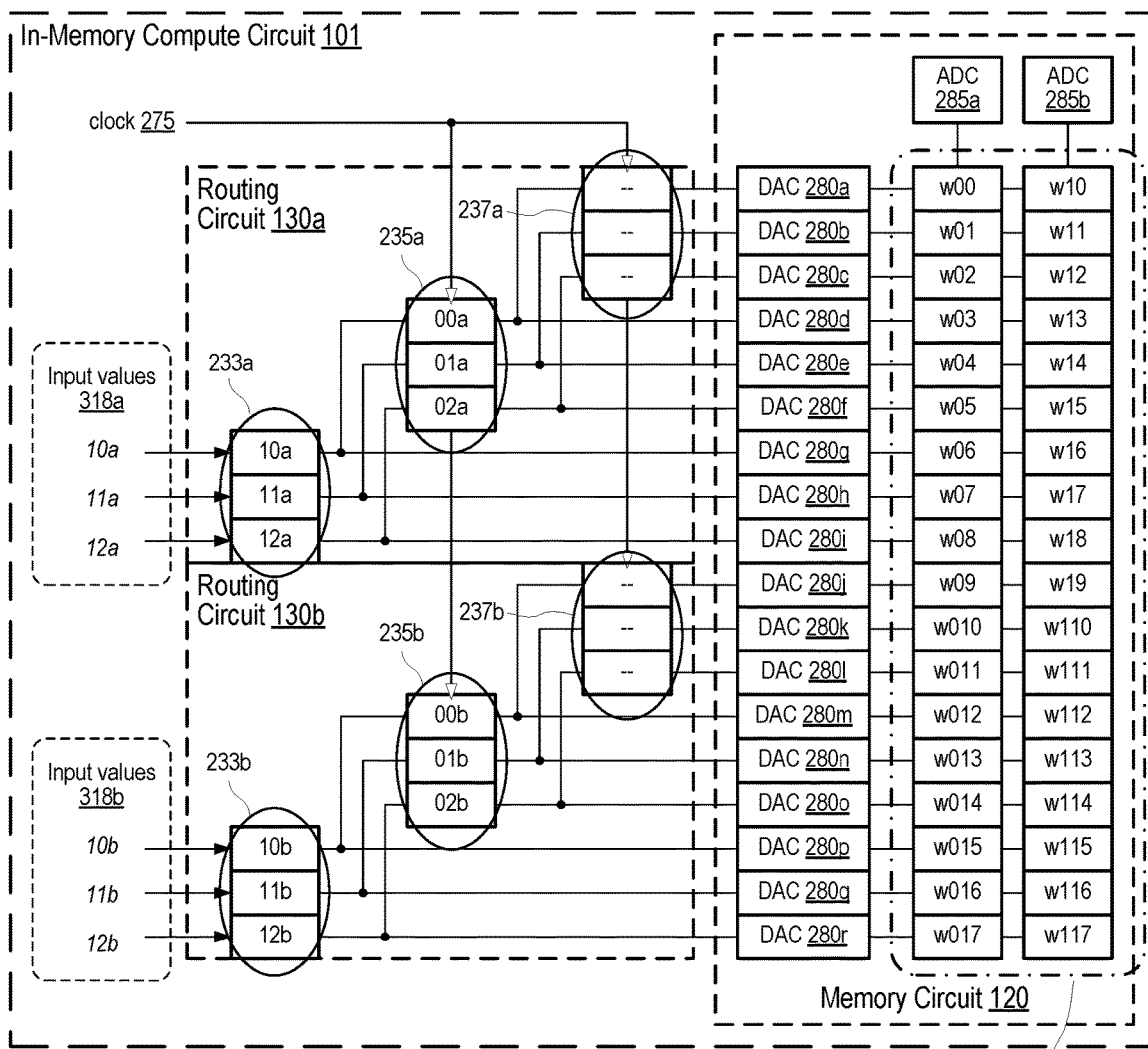
FIG. 3

800

```
During a series of clock cycles, routing, by a in-memory compute circuit,
a plurality of groups of input values to different ones of a set of
respective rows of the in-memory compute circuit.
810
```

During a subsequent clock cycle:
820

```
Combining the groups of input values with a set of weight
values stored in the set of respective rows to generate a set of
products.
830
```

```
Combining the set of products to generate an accumulated
output value.
840
```

During a first of a series of clock cycles, routing pixel data corresponding to adjacent pixels in a first column of pixels.
910

During a second of the series of clock cycles, routing pixel data corresponding to adjacent pixels in a second column of pixels that are adjacent to the first column of pixels.
920

During a third cycle of the series of clock cycles, routing pixel data corresponding to adjacent pixels in a third column of pixels that are adjacent to the second column of pixels, such that a particular three-pixel by three-pixel portion of an image is routed to the in-memory compute circuit.
930

During a fourth cycle of the series of clock cycles, generating an accumulated output value as a convolution of the portion of the image.
940

ACCELERATION OF IN-MEMORY-COMPUTE ARRAYS

BACKGROUND

Technical Field

Embodiments described herein are related to systems-on-a-chip (SoCs) and, more particularly, to methods for accelerating performance of an in-memory compute circuit.

Description of the Related Art

Multiply-accumulate (MAC) operations may be used in a variety of computer calculations, particularly in the areas of digital-signal processing and in video and graphics processing. One example of MAC operation usage is in convolutional neural networks (CNNs). CNNs are commonly used in image processing, such as object recognition in images. To accelerate image processing (e.g., to reduce an amount of time to recognize an object in an image) it may, therefore, be desirable to accelerate CNN operations. The MAC operation may be the smallest unit of computation on which some CNNs are built. Accordingly, optimizing the underlying execution of MAC operations may provide a technique for reducing CNN operation times.

In some systems, CNN operations may be implemented using software executing on a computer system. General purpose processing cores, however, may take an undesirable number of clock cycles to perform a single CNN operation. To improve the CNN computation speed, hardware accelerators may be employed to reduce this number of clock cycles. Traditional CNN hardware accelerators may rely on large, complex digital circuits to achieve highly parallelized, high-speed throughput. Such complex circuits may pose a challenge for designers to optimize, resulting in compromises among die size of circuits, power consumption, and costs of the hardware accelerators.

SUMMARY

In an embodiment, an apparatus includes an in-memory compute circuit that includes a memory circuit configured to generate a set of products by combining received input values with respective weight values stored in rows of the memory circuit, and to combine the set of products to generate an accumulated output value. The in-memory compute circuit may further include a control circuit and a plurality of routing circuits, including a first routing circuit coupled to a first set of rows of the memory circuit. The control circuit may be configured to cause the first routing circuit to route groups of input values to different ones of the first set of rows over a plurality of clock cycles, and the memory circuit to generate, on a clock cycle following the plurality of clock cycles, a particular accumulated output value that is computed based on the routed groups of input values.

In a further example, the received input values may be respective portions of pixel data. Ones of a first group of input values may be included in adjacent pixels in a first column of pixels. Ones of a second group of input values may be included in adjacent pixels in a second column of pixels, adjacent to the first column of pixels.

In another example, the control circuit may be further configured to route, using a second routing circuit of the plurality of routing circuits, different groups of input values to different ones of a second set of rows over the plurality of clock cycles. In an example, the first routing circuit may include a plurality of latching circuits. To route the groups of input values, the first routing circuit may be configured, in response to a transition of a clock signal, to shift a first group of input values from a first set of the latching circuits to a second set of the latching circuits, and to shift a second group of input values to the first set of the latching circuits.

In one example, the in-memory compute circuit may include a corresponding one of a plurality of digital-to-analog converters (DACs) coupled to a respective row of the rows of the memory circuit. To generate and combine a given set of products, the memory circuit may be further configured to use respective input values to generate a particular voltage levels on outputs of the corresponding DACs, and to generate an accumulated voltage level indicative of the accumulated output value using the outputs of the DACs and a column of memory cells of the memory circuit, wherein memory cells of the column of memory cells stores respective weight values.

In a further embodiment, the memory circuit may include an analog-to-digital converter (ADC) coupled to the column of memory cells. To generate the accumulated output value, the memory circuit may be further configured to use the ADC to convert the accumulated voltage level of the column to a digital value. In another embodiment, the control circuit may be further configured to use the accumulated output value as one of another group of input values in a subsequent clock cycle.

BRIEF DESCRIPTION OF THE DRAWINGS

The following detailed description makes reference to the accompanying drawings, which are now briefly described.

FIGS. 2-4 show block diagrams of another embodiment of the system of FIG. 1, and depict routing of data through the in-memory compute circuit over a series of clock cycles.

FIG. 8 illustrates a flow diagram of an embodiment of a method for operating an in-memory compute circuit.

FIG. 9 shows a flow diagram of an embodiment of a method for using an in-memory compute circuit to analyze pixel data from a portion of an image.

Figure 1:
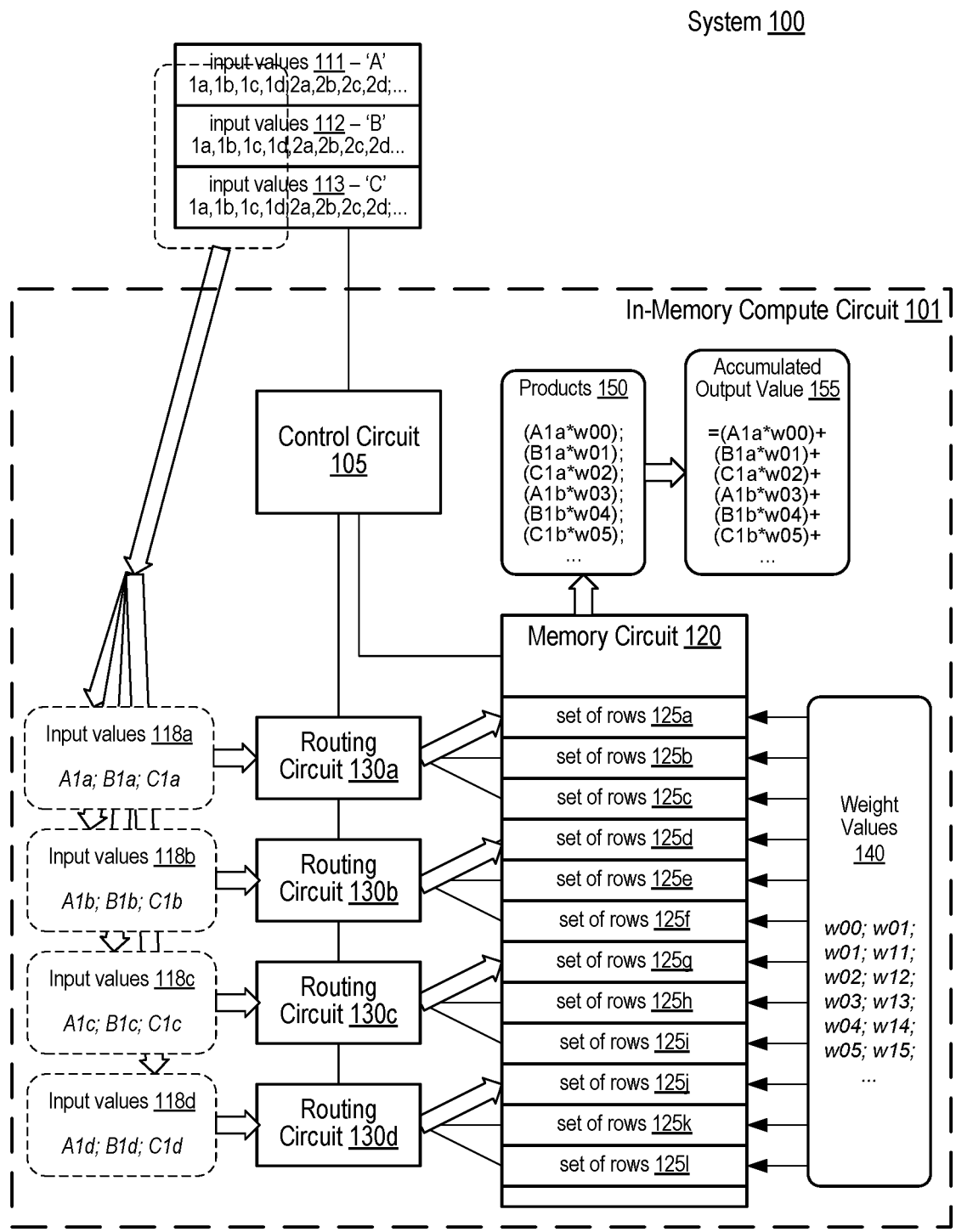
FIG. 1 illustrates a block diagram of an embodiment of a system that includes an in-memory compute circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

Accelerating the computation of convolutional neural networks through dedicated circuits may help to achieve compelling real-time user experiences and extended battery life in modern consumer electronics devices. One novel approach is use of mixed-signal "in-memory-compute" (IMC) arrays to further optimize the execution of MAC operations in CNN accelerators. IMC arrays may be capable of running CNN operations in an efficient manner in the analog domain rather than in the digital one. To achieve highly power-efficient MAC computations with IMC arrays, it may be desirable to maximize a number of open IMC memory rows at any given time such that a high level of parallelism in MAC computations is achieved within a given IMC array. Routing input data to a plurality of IMC rows may pose a challenge in the digital circuitry that surrounds the IMC array as well as the memories that feed data to the IMC block itself. For example, processing of an image with millions of pixels may require a demanding amount of pixel data to be fed to the IMC array at every clock cycle.

It is noted that, as used herein, an "open row" of an IMC is a row that contributes a value to the computation based on an input value to the open row and a value stored in a memory cell of the open row. A "closed row" may not contribute any values to the computation.

The present disclosure considers a novel digital circuit and data path which tightly surrounds an IMC array from a floorplan perspective and enables efficient, high-throughput delivery of data to the IMC array such that a plurality of rows in the IMC array may be open at any given clock cycle throughout the computation of a CNN layer. The disclosed embodiments address systems and methods for performing a MAC operation as part of a CNN. The disclosed methods may increase an efficiency for routing groups of input data to open rows of an IMC. An example of a novel in-memory compute circuit may include a memory circuit that performs a MAC operation by generating a set of products by combining received input values with respective weight values stored in rows of the memory circuit, and then combining the set of products to generate an accumulated output value. The in-memory compute circuit may further include a plurality of routing circuits coupled to sets of rows of the memory circuit, as well as a control circuit that is configured to cause the routing circuits to route groups of input values to different ones of the sets of rows over a plurality of clock cycles. The memory circuit may then generate an accumulated output value based on the routed groups of input values. Use of the disclosed IMC circuits may provide a capability to perform MAC operations more rapidly and/or using less power than traditional MAC circuits.

FIG. 1 illustrates a block diagram of one embodiment of a system that uses an in-memory compute circuit to perform a MAC operation on three groups of input values. As illustrated, system 100 includes in-memory compute circuit 101 that receives input values 111-113. In-memory compute circuit 101, in turn, includes control circuit 105, routing circuits 130a-130d (collectively routing circuits 130), and memory circuit 120 that further includes a plurality of sets of rows 125a-125l (collectively sets of rows 125).

As illustrated, in-memory compute circuit 101 includes memory circuit 120 that is configured to generate a set of products 150 by combining received input values 118a-118d with respective weight values 140 stored in sets of rows 125. Memory circuit may combine products 150 to generate accumulated output value 155. In some embodiments, each set of rows 125 may include one or more rows each with a respective plurality of memory cells, such that the memory cells are organized into a plurality of rows and columns. Weight values 140 are stored in at least a portion of these memory cells. For example, before a particular convolution operation begins, a processor in system 100 may cause weight values 140 to be sent to in-memory compute circuit 101 where they are stored in the memory cells. In some embodiments, each weight value may correspond to a particular row and column. For example, weight value "w00" may correspond to memory cell in a first column in a first row, "w01" to a memory cell in the first column of a second row, "w10" to a memory cell in a second column of the first row, and so forth.

Routing circuits 130, as shown, include routing circuit 130a coupled to sets of rows 125a-125c, routing circuit 130b coupled to sets of rows 125d-125f, routing circuit 130c coupled to sets of rows 125g-125i, and routing circuit 130d coupled to sets of rows 125j-125l. Each routing circuit 130 receives a respective group of input values 118a-118d. As illustrated, the groups of input values correspond to various sets of data received as input values 111-113. For example, routing circuit 130a receives input values 118a that includes A1a, B1a, and C1a, that correspond to the "1a" values from each of input values 111 ("A"), 112 ("B"), and 113 ("C"). For a given clock cycle, each of routing circuits 130, as shown, routes the respective group of input values to one of the three respective sets of rows.

As shown, control circuit 105 is configured to cause routing circuit 130a to route input values 118a to different ones of set of rows 125a over a first of a plurality of clock cycles. In two subsequent clock cycles, additional input values are routed to set of rows 125b, and then to set of rows 125c. After the third clock cycle, all three sets of rows 125a-125c may have been presented with respective input values. In a like manner, control circuit 105 is further configured to route, using routing circuit 130b, input values 118b to different ones of set of rows 125d over the first plurality of clock cycles. In the two subsequent clock cycles, additional input values are routed to set of rows 125e, and then to set of rows 125f. Routing circuits 130c and 130d route, concurrent with routing circuits 130a and 130b, input values 118c and 118d, respectively, to sets of rows 125g-125l such that all illustrated sets of rows 125 may be presented with input values by the end of the third clock cycle.

Control circuit 105 may further be configured to cause memory circuit 120 to generate, on a fourth clock cycle following the third clock cycle, accumulated output value 155 that is computed based on the routed groups of input values 118. For example, after the input values 118 are routed to the respective sets of rows 125, each memory cell in a given column of memory cells may output a respective signal that is indicative of a product of the corresponding input value 118 and the respective weight value 140 stored in the memory cell, thereby generating products 150. Accumulated output value 155 may then be indicative of a total value of all products 150 in a single column of memory cells.

As shown, products 150 includes input values 118a (A1a, B1a, and C1a) multiplied by respective weight values (w00, w01, and w02), resulting in values corresponding to A1a×w00, B1a×w01, and C1a×w02. Further products 150 include input values 118b-118d multiplied by their respective weight values 140, as well as additional input values routed during subsequent clock cycles further multiplied by respective one of weight values 140. Accordingly, the number of rows in memory circuit 120 determines a limit of the number of products that may be totaled for a given accumulated output value 155.

By using a plurality of routing circuits to route input values to respective rows of a memory circuit of an in-memory compute circuit, a desired number of rows may be opened for use in a single multiply-accumulate (MAC) operation. A number of columns in the memory circuit may further determine a number of respective MAC operations that may be performed concurrently. Such an in-memory compute circuit may provide a faster and/or more efficient technique for performing a number of MAC operations as compared to traditional MAC circuits.

It is noted that system 100, as illustrated in FIG. 1, is merely an example. The illustration of FIG. 1 has been simplified to highlight features relevant to this disclosure. Various embodiments may include different configurations of the circuit elements. For example, the number of rows in memory circuit 120 may be different based on a desired number of input values to be used in a single MAC operation. In a similar manner, the number of routing circuits may be different based on how quickly it is desired to perform a single MAC operation.

The system illustrated in FIG. 1 is shown in a simplified depiction for clarity. In-memory compute circuits may be implemented in various fashions. A more detailed example of operation of an in-memory compute circuit is shown in FIGS. 2-4.

Figure 2:
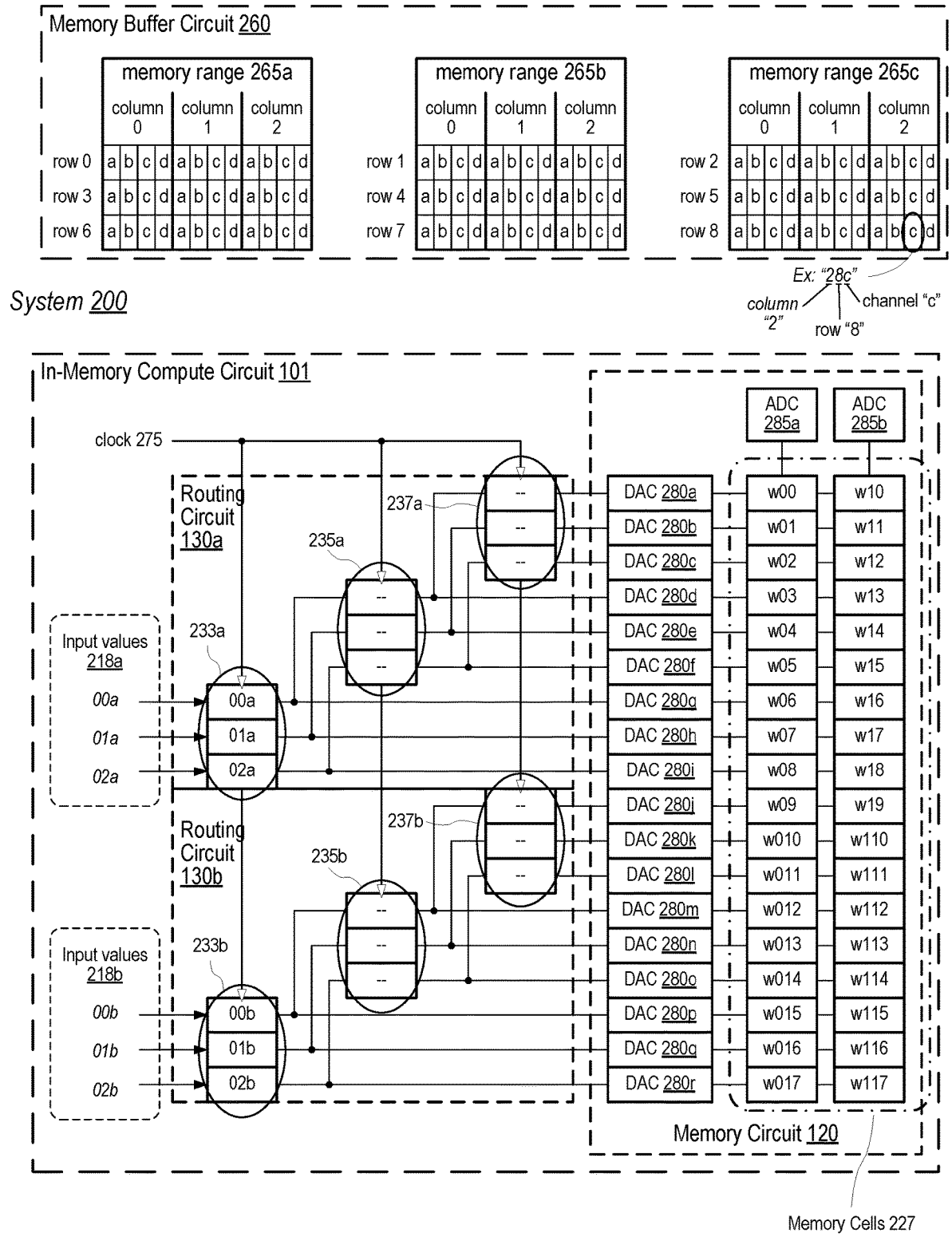
Figure 4:
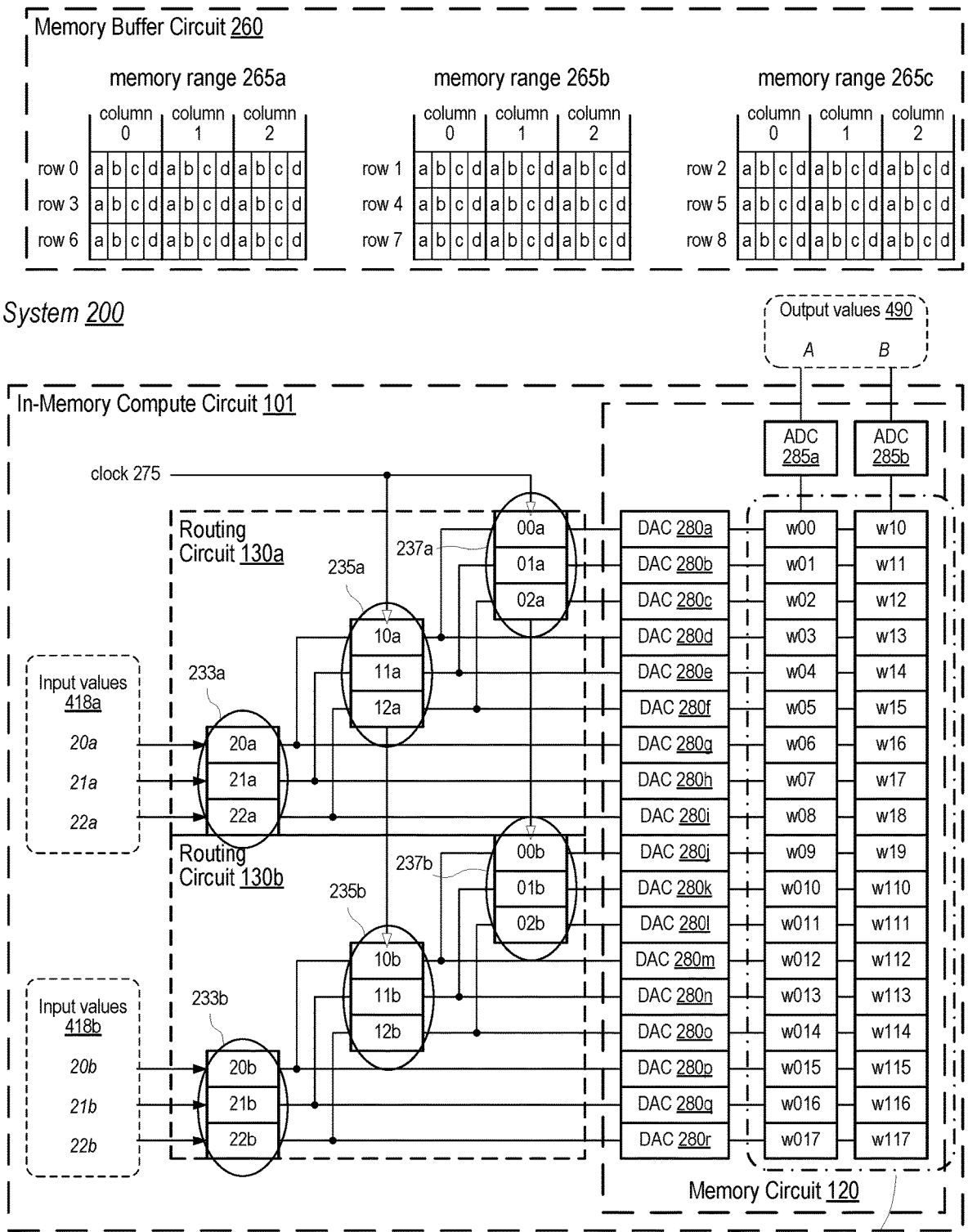

Moving to FIGS. 2-4, the in-memory compute circuit of FIG. 1 is shown with additional details for the routing circuits and the memory circuit. Each of FIGS. 2-4 depicts system 200 at a different point in time, demonstrating how data may be routed to different rows of memory circuit 120. In some embodiments, system 200 is an image processing circuit that may receive image data (including e.g., one or more frames of a video) and analyze the image to generate output data that is indicative of one or more characteristics of the image. System 200 includes in-memory compute circuit 101, and memory buffer circuit 260 that includes memory ranges 265a, 265b, and 265c (collectively memory ranges 265). In-memory compute circuit 101 includes, as previously described, routing circuits 130a and 130b as well as memory circuit 120. As illustrated in FIGS. 2-4, memory circuit 120 includes digital-to-analog converters (DACs) 280a-280r (collectively DACs 280) coupled to respective rows of memory cells 227. Memory circuit 120 further includes analog-to-digital converters (ADCs) 285a and 285b coupled to respective columns of memory cells 227. Routing circuits 130 each include three respective sets of flip-flop circuits, flip-flops 233a, 235a, and 237a for routing circuit 130a and flip-flops 233b, 235b, and 237b for routing circuit 130b.

As illustrated in FIG. 2, memory buffer circuit 260 includes a plurality of memory ranges, including memory ranges 265, that are configured to return a portion of stored data concurrently. In-memory compute circuit 101 may retrieve data from each of memory ranges 265 concurrently. For example, a read of data from column 0, row 0 of memory range 265a may overlap a read of data from column 0, row 1 of memory range 265b, as well as a read of column 0, row 2 of memory range 265c. In various embodiments, memory ranges 265 may be implemented as separate memory circuits, as different arrays within a same memory circuit, as a single multi-port memory array, or a combination thereof.

A memory access circuit (e.g., memory access circuit 545 shown in FIG. 5) may be configured to distribute pixel data of a digitized image among memory ranges 265. As shown, a digitized image may include a series of rows of pixels, including rows 0 through 8. These rows are distributed across memory ranges 265 such that consecutive rows are in different memory ranges, allowing three adjacent rows to be accessed in a same memory access cycle. For example, rows 0, 3, and 6 are in memory range 265a, rows 1, 4, and 7 in memory range 265b, and rows 2, 5, and 8 are in memory range 265c. Accordingly, any three consecutive rows may be accessed concurrently.

Each row of pixel data in memory buffer circuit 260 is shown with three columns of pixel data, columns 0-2. Data corresponding to one pixel is stored at each combination of row and column numbers, such that twenty-seven pixels are shown in FIG. 2. Only three columns and nine rows are shown for clarity, the digitized image may include more rows and/or columns of pixel data. Each pixel includes four data values, labeled 'a,' 'b,' 'c,' and 'd.' These four values may correspond to any suitable format for representing one pixel of an image. For example, values for a, b, and c may correspond to levels of red, green, and blue color, respectively, while a value of d indicates a level of luminance for the pixel. Other types of pixel data formats are contemplated, such as cyan, magenta, yellow, and key (CMYK), hue, saturation, and lightness (HSL), and hue, saturation, and value (HSV), and different formats may include a different number of values to represent a given pixel.

In some embodiments, the pixel data may represent characteristics of a respective pixel other than color. For example, the pixel data may correspond to a likelihood that a respective pixel is part of a particular shape. The values for a, b, c, and d may, respectively, indicate a probability that the pixel is included in a circle, square, triangle, and oval. In some embodiments, more complex shapes may be indicated within the pixel data, such as different types of animals, tools, furniture, and the like. In addition, it is noted that data for one pixel may include any suitable number of values, including a different number of values than four. For example, one type of pixel data may include a respective value for various polygons, from a triangle to a decagon.

As shown, in-memory compute circuit 101, includes sets of rows of memory cells 227, as well as DACs 280 and ADCS 285a and 285b. Each of DACs 280 is coupled to a respective row of memory cells 227, while ADC 285a is coupled to a first column of memory cells 227 and ADC 285b is coupled to a second column of memory cells 227. In-memory compute circuit 101 is configured to receive a plurality of weight values (w00 to w117) to be stored in memory cells 227 for at least a portion of the sets of rows. The illustrated weight values are labeled by row and column numbers, e.g., wcr, where 'c' represents the column number ('0' or '1') and 'r' represents the row ('0' to '17'). Accordingly, w00 to w017 are the weight values stored in rows 0 to 17 of column 0 and w10 to w117 are the weight values stored in rows 0 to 17 of column 1.

During a series of cycles of clock 275, in-memory compute circuit 101 is configured to route groups of the pixel data to the sets of rows of memory cells 227. The groups of the pixel data include portions of stored pixel data from memory ranges 265. In-memory compute circuit 101 uses routing circuits 130 to route these groups of pixel data to the rows of memory cells 227. As shown, input values 218a include three values, 00a, 01a, and 02a. These values correspond to the 'a' pixel data from column 0 of rows 0, 1, and 2 (e.g., '01a' indicates pixel data from column 0, row 1, portion a, from memory range 265b). Similarly, input values 218b includes values 00b, 01b, and 02b, corresponding to the 'b' values for three pixels in column 0, rows 0, 1, and 2. Routing the pixel data includes, in response to a first transition of clock 275, routing input values 218a and 218b, each indicative of different characteristics of a respective pixel, to respective ones of the respective rows of memory cells 227. For example, input values 218a are routed to rows 6, 7, and 8 using routing circuit 130a, while input values 218*b* are routed to rows 15, 16, and 17 using routing circuit 130*b*. While not shown for clarity, pixel data corresponding to the 'c' and 'd' values of the same column of pixels may be sent to additional rows of memory cells using routing circuits 130*c* and 130*d* from FIG. 1.

As illustrated, each of input values 218*a* is sent to a respective one of flip-flops 233*a*, and similarly, input values 218*b* are sent to flip-flops 233*b*. Flip-flops 233, 235, and 237 may be implemented using any suitable clocked latching circuit to store the received values in response to an active transition of clock 275. In various embodiments, an active transition may be rising, falling, or both. Each of flip-flop 233, 235, and 237 is coupled to an input of a respective one of DACs 280.

FIG. 3 depicts system 200 after a subsequent transition of clock 275. Routing circuit 130*a* is configured, in response to a second transition of clock 275, to shift input values 218*a* from flip-flops 233*a* to flip-flops 235*a*, and shift input values 318*a* to flip-flops 233*a*. In a similar manner, routing circuit 130*b* is configured to shift input values 218*b* from flip-flops 233*b* to flip-flops 235*b*, and shift input values 318*b* to flip-flops 233*b*. Input values 318*a* and 318*b*, as shown, correspond to pixel data from column 1 of rows 0, 1, and 2, of memory buffer circuit 260, e.g., a column of pixel data adjacent to the column of pixel data corresponding to input values 218*a* and 218*b*. In a similar manner as described above, pixel data corresponding to the 'c' and 'd' values of column 1 may be sent to the additional rows of memory cells using routing circuits 130*c* and 130*d* from FIG. 1. Routing circuits 130*c* and 130*d* may be similarly configured to shift their respective values for column 0 from a first set of flip-flops to a second set of flip-flops, and shift the pixel data for column 1 into the first set of flip-flops.

FIG. 4 corresponds to system 200 after a third transition of clock 275. As described, routing circuits 130*a* and 130*b* are further configured, in response to the third transition, to shift the input values 218*a* and 218*b*, respectively, to flip-flops 237*a* and 237*b*, and shift input values 318*a* and 318*b* to flip-flops 235*a* and 235*b*, respectively. Routing circuits 130*a* and 130*b* receive input values 418*a* and 418*b*, and shift these values, respectively, into flip-flops 233*a* and 233*b*. Although not shown, routing circuits 130*c* and 130*d* may perform similar data shifts.

After the third transition of clock 275, 'a' pixel data values for columns 0, 1, and 2 of memory buffer circuit 260 are routed to rows of memory circuit 120 coupled to DACs 280*a*-280*i*, and 'b' pixel data values for the same columns are routed to rows of memory circuit 120 coupled to DACs 280*j*-280*r*. As described, 'a' pixel data may correspond to levels of the color red in each pixel, while 'b' pixel data may correspond to levels of the color green in each pixel. Accordingly, each routing circuit 130 may route data associated with a particular characteristic of a corresponding pixel. It is noted that, in the current example, data for a three-by-three group of pixels has been routed to the rows of in-memory compute circuit 101, comprised of columns 0-2 and rows 0-2, with pixel data corresponding to row, column 1, being in the center of this group. In-memory compute circuit 101, in the present embodiment, is configured to perform one or more convolution operations on this three-by-three group.

These convolutions may include producing a plurality of products based on the input values and the weight values, and then adding sets of products together. In response to a fourth transition of clock 275, in-memory compute circuit 101 may be further configured to generate a set of products using input values 218, 318, 418 and the stored weight values. For example, in a first convolution operation, input value '00a' may be multiplied by w00 to generate a first product, and similarly, input values 01a, 02a, 10a, 11a, 12a, 20a, and so forth, multiplied by the corresponding weight values in the first column of memory cells 227. These products in the first column may then be totaled to generate a first convolution value, e.g., output value 490A. In second convolution operation, the same input values may be multiplied by a different set of weight values, w10-w117, to generate a second set of products which are then added together to generate a second convolution output, e.g., output value 490B.

To generate and combine a given set of products, memory circuit 120 is configured to use respective ones of input values 218, 318, and 418 to generate a particular voltage levels on outputs of the corresponding DACs 280. For example, DAC 280*a* may generate a particular output voltage level based on a value of 00a. DACs 280*b*-280*r* may similarly generate respective output voltage levels based on the respective input values. Memory circuit 120 may be further configured to generate an accumulated voltage level indicative of the accumulated output value using the outputs of the DACs and a first column of memory cells 227. Memory cells 227 of the first column of memory cells 227 store respective weight values w00-w017, which allow a portion of the respective DAC 280 output voltage level to propagate through the corresponding memory cell 227. For example, the output value of DAC 280*a* is based on the value of 00a. Weight value w00 allows a portion of this output voltage level, e.g., in proportion to the value of w00, to propagate to the output of the memory cell 227 in which w00 is stored. Outputs of at least a portion of memory cells 227 in the first column are accumulated to produce an accumulated voltage level. To generate accumulated output value 490A, memory circuit 120 is further configured to use ADC 285*a* to convert the accumulated voltage level of the column to a digital value.

A second column of memory cells 227 that store weight values w10-w117 may be used to generate a second accumulated voltage level associated with a second convolution operation of the same input values. Memory circuit 120 may be further configured to use ADC 285*b* to convert this second accumulated voltage level of the second column to output value 490B. Although two convolution operations are shown in FIG. 4, additional columns of memory cells 227 may be included to perform additional convolution operations. Various different weight values may be used in the different convolution operations to emphasize different characteristics and/or different pixels in a particular three-by-three group of pixels. After a set of output values 490 have been generated for a given group of pixels, the disclosed process may repeat for a subsequent group of pixels and may continue to repeat until all, or a desired portion of, the pixels of the digitized image have been included in at least one set of convolution operations.

It is noted that the embodiment of FIGS. 2-4 are one depiction of a system for performing convolution operations for a digitized image. Although the illustrated embodiment was directed towards operations on a three-by-three group of pixel data, any suitable number of data points may be supported in other embodiments. Convolution analysis of a digitized image is used as an example use case. The techniques described in regards to FIGS. 2-4 may be applied to any suitable type of data in which multiply-accumulate functions may be used.

The descriptions of FIGS. 2-4 describe use of pixel data from a digitized image as input values to the in-memory compute circuits disclosed herein. This description included references to processing multiple groups of pixel data from the digitized image. One example for how groups of pixel data may be processed is presented now in FIG. 5.

Figure 5:
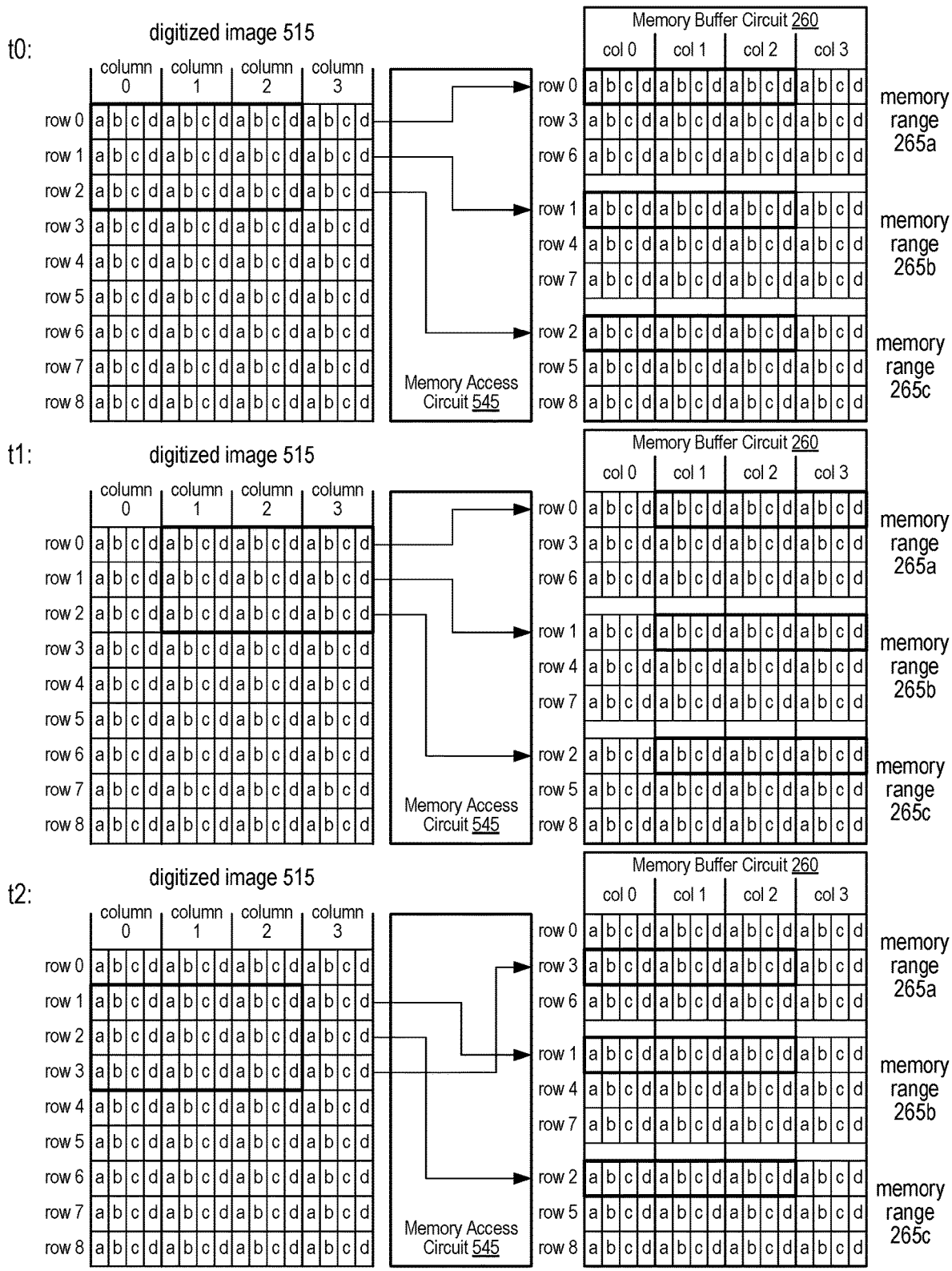
FIG. 5 depicts several tables at three different points in time, showing selection of image data in an embodiment of the in-memory compute circuit of FIGS. 1-4.

FIG. 5 shows an example of a digitized image may be processed using the in-memory compute circuit of FIGS. 1-4. An example of different portions of digitized image 515 being processed at different times is illustrated. Digitized image 515 may correspond to any suitable type of image file format, such as raw image file format (RAW), Joint Photographic Experts Group (JPEG), Tagged Image File Format (TIFF), Windows bitmap (BMP), Portable Network Graphics (PNG), and the like. Digitized image 515 includes pixel data (a given pixel's data values represented by a, b, c, and d) arranged in columns and rows in an order in which the pixels may be rendered on a display. Although four columns and nine rows are shown, digitized image 515 may include any suitable number of columns and rows of pixel data. Memory access circuit 545 may be used to copy the pixel data in digitized image 515 to memory buffer circuit 260.

Prior to time t0, memory access circuit 545, as shown, is configured to distribute pixel data from the columns and rows of digitized image 515 among memory ranges 265 of memory buffer circuit 260. The pixel data is distributed such that adjacent rows of digitized image 515 are copied into different ones of memory ranges 265, thereby enabling pixel data from three adjacent rows to be read concurrently.

At time t0, a first portion of a three-by-three portion of digitized image 515 is processed using the techniques described above. This three-by-three portion includes a first group of input values that are included in adjacent pixels in a first column of pixels, e.g., column 0, rows 0-2, a second group of input values that are included in adjacent pixels in a second column of pixels (column 1, rows 0-2), adjacent to the first column of pixels. A third group of input values are included in adjacent pixels in a third column of pixels (column 2, rows 0-2), adjacent to the second column of pixels. These three columns of pixel data may be routed to respective rows of memory circuit 120 over the course of three consecutive cycles of clock 275, as described above.

One or more output values may be generated during a fourth cycle. In-memory compute circuit 101, as shown in FIGS. 2-4, is configured to perform a convolution of the three-by-three portion of digitized image 515. To perform the convolution, in-memory compute circuit 101 is configured, as previously described, to generate a set of output values, ones of the set of output values indicative of respective characteristics of the portion of the digitized image. For example, one particular output value of the set may provide an indication of a degree of contrast between a middle pixel of the three-by-three portion, e.g., the pixel at row 1, column 1, and the surrounding eight pixels.

At time t1, a next three-by-three portion of digitized image 515 may be processed. As illustrated, the second and third groups of input values are reused, and the first group of input values are replaced by a fourth group of input values. This fourth group of input values are included in adjacent pixels in a fourth column of pixels (column 3, rows 0-2), adjacent to the third column of pixels. After routing the groups of input values to appropriate rows of memory circuit 120, another convolution operation may be performed, generating, for example, an indication of a degree of contrast between a middle pixel of the new three-by-three portion, e.g., the pixel at row 1, column 2, and the surrounding eight pixels. This process may repeat, shifting by one column of pixel data for each convolution operation, until all pixels of rows 0-2 have been processed.

At time t2, a different three-by-three portion of digitized image 515 may be processed by shifting down one row. As shown, the different three-by-three portion includes pixel data from three adjacent columns (columns 0-2) and three adjacent rows (rows 1-3). Convolution operations are repeated for rows 1-3, and may span across all columns in these rows. This process for processing the pixel data in the rows of digitized image 515 may be repeated until all the pixel data from all rows and all columns has been suitably processed.

It is noted that the example of FIG. 5 is one embodiment for demonstrating disclosed concepts. As stated, although only four columns and nine rows of pixel data are illustrated for brevity, digitized images may include any suitable number of rows and columns of pixel data. In addition, a three-by-three portion of the digitized image is shown as being processed for each convolution operation. In other embodiments, any suitably sized portion of a given digitized image may be processed for a given convolution. For example, a five-by-five portion, a four-by-six portion, and the like.

In the description of FIG. 5, portions of a digitized image are described as including several adjacent rows and columns of pixel data. These rows of pixel data may be buffered in a memory buffer circuit with a plurality of memory ranges, and then routed to various rows of memory cells in an in-memory compute circuit. The routing of the pixel data from memory ranges 265 may be implemented using a variety of techniques. One such technique is described in FIG. 6.

Figure 6:
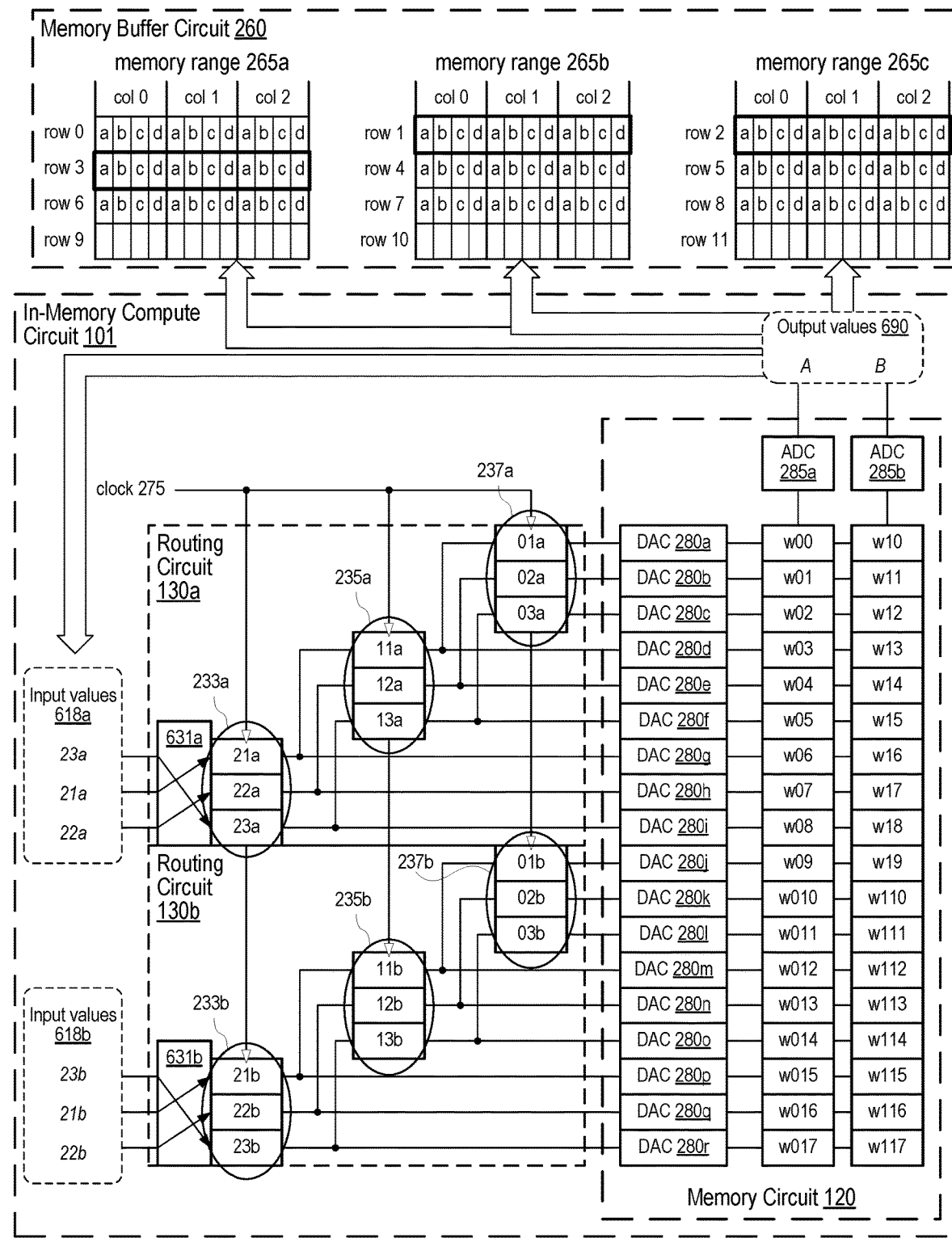
FIG. 6 illustrates another embodiment of the system of FIG. 1 in which input data is multiplexed to different inputs before being routed.

FIG. 6 shows an example of a system for routing input values from a memory buffer to an in-memory compute circuit. System 200 includes the same elements as described in regards to FIGS. 1-4. In FIGS. 2-4, input data from rows 0-2 is routed to particular rows of memory cells in memory circuit 120. In FIG. 6, input data from rows 1-3 is routed to memory circuit 120. Operations associated with FIG. 6 may take place after input values from all columns in rows 0-2 has been processed.

As illustrated, input values from rows of a different three-by-three portion of memory buffer circuit 260 may be routed to respective subsets of the rows of memory circuit 120. It is noted that two of the three rows of the different three-by-three portion include the same input values as the particular portion described in FIGS. 2-4. In some embodiments of in-memory compute circuit 101, memory ranges 265 may be hardwired to particular inputs of routing circuits 130. For example, memory range 265a may be wired to respective first inputs of routing circuits 130, memory range 265b to a second input, and memory range to a third input.

In-memory compute circuit 101 may be configured to, during a series of clock cycles shift the input values of rows 1 and 2 to the first and second sets of rows, respectively. As shown in FIG. 6, input values 618a and 618b each include one input value from each of rows 1-3. The top value, "23a," corresponds to an 'a' value from column 2, row 3, from memory range 265a. The second value, "21a," is an 'a' value from column 2, row 1 from memory range 265b, and the third value, "22a," is an 'a' value from column 2 of row 2, from memory range 265c. To reduce a time for processing data in memory buffer circuit 260, the weight values stored in memory circuit 120 may remain constant, for at least a given set of data values stored in memory buffer circuit 260. Accordingly, to apply the correct weight values for a given three-by-three portion, a top row of the portion should be routed to a top input of routing circuits 130, a middle row to the middle input, and a bottom row to the bottom input.

Accordingly, values from row 3 should be routed to the bottom input, and values from rows 1 and 2 should be routed to the top and middle inputs respectively. Since, as described for the current example, memory ranges 265a, 265b, and 265c are hardwired to the top, middle, and bottom inputs, respectively, input values 618a are shifted using multiplexing circuit (MUX) 631a, such that the row 3 value (23a) is shifted down to the bottom one of flip-flops 233a, the row 1 value (21a) is shifted up to the top one of flip-flops 233a, and the row 2 value (22a) is shifted up to the middle one of flip-flops 233a. In a similar manner, MUX 631b may be used to shift input values 618b to the desired ones of flip-flops 233b. It is noted that MUXs 631a and 631b may include circuits for routing any of the respective three input values into any of the respective three flip-flops.

As shown, input values are routed into flip-flops 233a, 233b, 235a, 235b, 237a, and 237b such that input values from row 1 are in the top flip-flops, values from row 2 are in the middle flip-flops, and values from row 3 are in the bottom flip-flops. In-memory compute circuit 101 may then generate one or more sets of products using the values from rows 1-3 and the stored weight values, and generate accumulated output values 690A and 690B by accumulating at least a subset of these sets of products. The generated output values 690A and 690B may be stored in memory buffer circuit 260, such as in row 9, or stored in a different memory circuit such as a system memory (not shown).

In some embodiments, in-memory compute circuit 101 may be further configured, at a subsequent point in time, to route accumulated output values 690A and 690B as input values to a particular set of the rows of memory cells. For example, output values 690A and 690B may be included, in a subsequent cycle, in input values 618a and 618b along with values from rows 2 and 3. In another example, input values 618a and 618b may include a plurality of rows of previously stored output values, such that all three input values correspond to generated output values from memory circuit 120. Such a feedback of generated outputs may allow for a further processing of the characteristics of the input values stored in memory buffer circuit 260. For example, one round of convolution operations on a given image may produce output values indicative of an inclusion of a respective pixel being included in various geometric shapes. A subsequent round of convolution operations may utilize the geometric shape data to produce output values indicative of an inclusion of the respective pixel being included in images of various animals.

It is further noted that the example of FIG. 6 is merely for demonstrating the disclosed techniques. Although only two sets routing circuits are illustrated, additional routing circuits may be included, such as routing circuits 130c and 130d in FIG. 1. Although two output values are shown, other embodiments may include any suitable number of output values generated in a given clock cycle.

Figure 7:
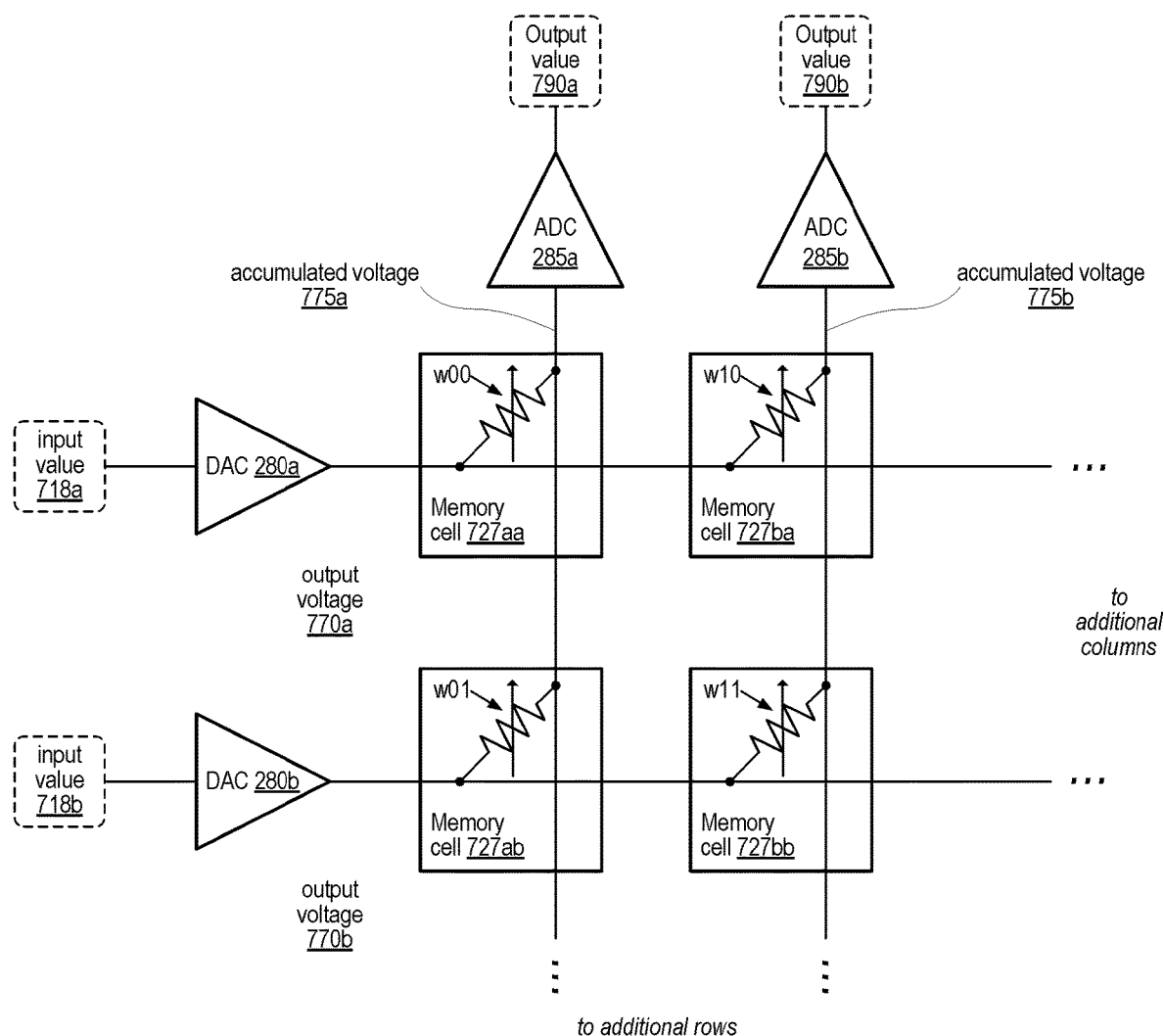
FIG. 7 shows a block diagram of an embodiment of memory cells included in an in-memory compute circuit.

In the descriptions of FIGS. 1-6, the memory cells of the memory circuit are described as generating an output voltage level that is indicative of a product of a respective input value and stored weight value. Such memory cells may be implemented in a variety of fashions. FIG. 7 illustrates one such implementation.

Turning to FIG. 7, a block diagram of an embodiment of memory cells used in an in-memory compute circuit is depicted. Many different types of memory cell circuits may be used to implement an IMC circuit. FIG. 7 is an embodiment demonstrating one such type of memory cell circuit. Other memory cells, for example, may include flash memory cells, or SRAM cells with an addition of capacitors. Memory circuit 120, as illustrated, includes DACs 280a and 280b, ADCs 285a and 285b, and memory cells 727aa, 727ab, 727ba, and 727bb (collectively memory cells 727). Although a two-by-two array of memory cells are shown, any suitable number of rows and columns of memory cells 727 may be implemented.

As described above, memory circuit 120 may be configured to perform multiply-accumulate compute (MAC) operations using input values and weight values as the operands. As shown, each column of memory cells 727 may be used to generate a respective MAC operation, with each MAC operation using the same input values, but independent weight values.

Prior to performing a MAC operation, memory cells 727 may be loaded with weight values, such as weight values 140 in FIG. 1. As illustrated, memory cells 727aa, 727ab, 727ba, and 727bb store weight values w00, w01, w10, and w11, respectively. Each weight value may determine an amount of transconductance of a respective memory cell 727 between an output of one of DACs 280 to an input of one of ADCs 285.

After the weight values 140 have been stored, input values are routed to respective rows of memory circuit 120. As shown, input value 718a is routed to an input of DAC 280a and input value 718b is routed to an input of DAC 280b. DACs 280a and 280b each generate a respective one of output voltages 770a and 770b using the respective input value 718. Inputs to memory cells 727 on a same row receive the same output voltage. Accordingly, memory cells 727aa and 727ba each receive output voltage 770a at their respective inputs and memory cells 727ab and 727bb each receive output voltage 770b. Based on the weight value stored in a respective memory cell 727, the amount of transconductance determines an amount of current that is allowed to pass from the output of a given DAC 280 to an input of a given ADC 285. Memory cells 727 may, therefore, be configured to pass an amount of current that is indicative of the input value multiplied by the weight value. The passed currents contribute to an accumulated voltage 775a or 775b that is applied to an input of each of ADCs 285. Each memory cell in a given column essentially adding its respective current to a total current for the given column. This total current may be converted to an accumulated voltage 775 by passing the current through a resistive impedance, a higher total current producing a higher accumulated voltage 770.

As shown, accumulated voltage 775a may be determined based on input value 718a multiplied by w00 plus input value 718b multiplied by w01 plus input values for any additional rows of memory cells 727 multiplied weight values stored in those additional rows of memory cells. In a similar manner, accumulated voltage 775b may be determined based on input value 718a multiplied by w10 plus input value 718b multiplied by w11 plus input values for additional rows of memory cells 727 multiplied corresponding weight values. The weight values, therefore, may enable a particular input value, e.g., input value 718a, to contribute more to one accumulated voltage 770 and less to another. For example, values of w00 and w10 may be chosen to produce a higher transconductance in memory cell 727aa, than in memory cell 727ba, thereby resulting in output voltage 770a contributing more current to accumulated voltage 775a than to accumulated voltage 775b.

As illustrated, ADCs 285 convert the respective accumulated voltages 775a to corresponding digital values. ADC 285a, for example, may be configured to produce a digital value that is proportional to a level of accumulated voltage 775a to produce output value 790a. ADC 285b may be similarly configured to generate output value 790*b* proportional to a level of accumulated voltage 775*b*. Output values 790 may, accordingly, be indicative of MAC operations based on input values 718 and weight values in the respective columns of memory cells.

ADCs 285 may be configured to generate output values 790 with any suitable number of bits of accuracy. In some embodiments, DACs 280 and ADCs 285 may be configured to generate a set of output values 790 in a single clock cycle (e.g., a cycle of clock 275 in FIGS. 2-4 and 6). In other embodiments, multiple clock cycles may be used to produce a given set of output values 790.

It is noted that the memory circuit of FIG. 7 is one example. Only elements for demonstrating the disclosed concepts have been illustrated. In other embodiments, additional elements may be included. For example, some embodiments may include additional rows and/or columns of memory cells and corresponding DACs and ADCs. Each column, in some embodiments, my include a resistive element for converting currents into proportionate voltage levels.

The in-memory compute circuits and techniques described above in regards to FIGS. 1-7 may be operated using a variety of methods. Two methods associated with operation of an in-memory compute circuit are described below in regards to FIGS. 8-9.

Proceeding to FIG. 8, a flow diagram for an embodiment of a method for performing a multiply-accumulate compute operation by an in-memory compute circuit is shown. As shown, the MAC operation is used to multiply a plurality of input values by a corresponding plurality of weight values, and then total the resulting products. Such MAC operations may be used in a variety of different applications, including for example, operations in a neural network, image analysis, digital-signal processing such as power conversion and motor control, and other applications. Method 800 may be performed by, for example, in-memory compute circuit 101 in FIGS. 1-4 and 6. Referring collectively to FIGS. 1 and 8, method 800 begins in block 810.

At block 810, method 800 includes, during a series of clock cycles, routing a plurality of groups of input values 118 to different ones of sets of rows 125 of in-memory compute circuit 101. As shown in FIG. 1, routing circuits 130*a*-130*d* are used to route input values 118*a*-118*d*, respectively, to particular ones of sets of rows 125. This first group of input values may be routed to first sets of rows in a first clock cycle. Additional groups of input values from input values 111-113 may be routed in additional ones of the series of clock cycles. In various embodiments, routing circuits 130 may route the additional groups to different ones of the sets of rows 125, or shift the previously routed groups to different sets of rows and route each additional group to the first sets of rows.

Method 800, at block 820, further includes, during a subsequent clock cycle following the series of clock cycles, performing operations of blocks 830 and 840 to perform a MAC operation. After input values 118 have been routed during the series of clock cycles, method 800, at block 830, includes combining, by in-memory compute circuit 101, the groups of input values 118 with a set of weight values 140 stored in sets of rows 125 to generate a set of products 150. Weight values 140 may be stored in memory cells of memory circuit 120 before operations of block 810 are performed.

In some embodiments, memory circuit 120 includes a DAC for at least some of the rows of memory cells, such as DACs 280 shown in FIGS. 2-4 and 6-7. Each of input values 118 may cause a respective DAC to generate an output voltage with a level that is dependent upon the respective input value. Memory cells of memory circuit 120 may generate a particular current based on the output voltage of a respective DAC and a weight value stored in the corresponding memory cell. The generated current may, therefore, be indicative of a product of a corresponding input value and weight value.

Method 800 also includes, at block 840, combining the set of products 150 to generate accumulated output value 155. In-memory compute circuit 101 may generate accumulated output values 155 that are indicative of a total of the input values multiplied by a particular portion of the weight values. As illustrated, combining the groups of input values 118 with weight values 140 to generate products 150 includes generating a single analog signal for respective ones of products 150. As described in regards to FIG. 7, currents generated in block 830 may be combined to generate a single current that corresponds to the sum of the generated currents from a given column of memory circuit 120. This total current may flow through a particular resistive impedance to generate a corresponding accumulated voltage level. This accumulated voltage level may then be sampled by an ADC (e.g., ADCs 285 in FIGS. 2-4 and 6-7) to generate a given one of accumulated output values 155. Each of accumulated output values 155 may, therefore, be indicative of a MAC operation using the routed input values and one column of weight values. In some embodiments, multiple MAC operations may be performed in parallel using the same routed input values and different columns of weight values.

In some embodiments, method 800 may end in block 840, or in other embodiments, may repeat some or all operations. For example, method 800 may return to block 810 to perform another set of MAC operations using different groups of input values. It is noted that the method of FIG. 8 is merely an example for performing a MAC operation using an in-memory compute circuit.

Moving now to FIG. 9, a flow diagram for an embodiment of a method for using pixel data from a digitized image as input values for a MAC operation is shown. In a similar manner as method 800, method 900 may be performed by an in-memory compute circuit, such as in-memory compute circuit 101 in FIGS. 1-4 and 6. Referring collectively to FIGS. 2-4, and 9, method 900 begins in block 910.

Method 900 at block 910, includes, during a first of a series of cycles of clock 275, routing pixel data corresponding to adjacent pixels in a first column of pixels. As illustrated in FIG. 2, memory buffer circuit 260 may store pixel data from a digitized image, such as digitized image 515 in FIG. 5. The pixel data may be distributed by rows across different memory ranges 265 of memory buffer circuit 260, such that any three consecutive rows of pixel data are spread across all three memory ranges 265. Each of the three memory ranges 265 may allow concurrent access, thereby enabling three consecutive rows of pixel data to be retrieved from memory buffer circuit 260 in a same cycle of clock 275 and routed to a first set of rows of memory circuit 120.

As shown, routing the pixel data includes routing a plurality of values indicative of different characteristics of a given pixel to respective ones of a set of respective rows. For example, each set of pixel data illustrated in memory buffer circuit 260 includes four values, indicated by the letters 'a,' 'b,' 'c,' and 'd.' As described above, the various values included in the pixel data may correspond to a color of a corresponding pixel, and/or probabilities of the corresponding pixel is included within a particular shape or object. Each of routing circuits 130 may route data for three pixels in a given column for a given one of the characteristics. Input values 218a includes values for the 'a' characteristic of pixels in column 0, rows 0-2. In a similar manner, input values 218b includes values for the 'b' characteristic of the same pixels. Although not shown in FIG. 2, two more sets of values from the same column of three pixels, corresponding to the 'c' and 'd' characteristics, may be routed by routing circuits 130c and 130d (from FIG. 1).

At block 920, method 900 includes, during a second cycle of clock 275, routing pixel data corresponding to adjacent pixels in a second column of pixels that are adjacent to the first column of pixels. As shown in FIG. 3, an adjacent column of pixel data (column 1, rows 0-2) is routed by routing circuits 130 during a second cycle of clock 275. In the illustrated embodiment, pixel data from column 0 is shifted to a second set of rows of memory circuit 120, different from the first set, while pixel data from column 1 is routed to the first set of rows. In other embodiments, pixel data from column 0 may remain in the first set of rows, while the pixel data from column 1 is routed to the second set of rows.

At block 930, the method also includes, during a third cycle of clock 275, routing pixel data corresponding to adjacent pixels in a third column of pixels that are adjacent to the second column of pixels. As shown in FIG. 4, a next adjacent column of pixel data (column 2, rows 0-2) is routed by routing circuits 130 during a third cycle of clock 275. As depicted, pixel data from column 0 is shifted to a third set of rows of memory circuit 120, different from the first and second sets, pixel data from column 1 is shifted to the second set of rows, and pixel data from column 2 is routed to the first set of rows. In other embodiments, pixel data from columns 0 and 1 may remain in the first and second sets of rows, while the pixel data from column 2 is routed to the third set of rows.

Method 900 includes, at block 940, during a fourth cycle of clock 275, generating the accumulated output value as a convolution of a portion of digitized image 515. After the pixel data from column 2 has been routed, a particular three-pixel by three-pixel portion of digitized image 515 is presented to memory circuit 120. Weight values may be selected and stored in memory circuit 120 such that memory circuit 120 is configured to perform one or more convolution operations on the portion of digitized image 515. Such convolutions may, for example, generate one or more output values 490 that are indicative of a relationship between one of the pixels of the three-by-three portion and the surrounding eight pixels, such as a level of contrast in color and/or brightness between the pixels. Such convolution data may be used, in some embodiments, to identify particular shapes and/or objects in digitized image 515.

In some embodiments, method 900 may end in block 940, or in other embodiments, may repeat some or all operations. For example, method 900 may return to block 910, at a subsequent point in time, to route pixel data of rows of a different portion of digitized image 515 to the first, second and third sets of rows of memory circuit 120. In some cases, one or two of the three rows of the different three-by-three portion of the image may include the same pixels as the particular three-by-three portion of the image. For example, in a subsequent convolution operation, the different portion may include pixels included in columns 0-2, rows 1-3.

It is noted that methods 800 and 900 are examples for performing MAC operations using an in-memory compute circuit. Performance of various operations of methods 800 and 900 may be performed concurrently. For example, blocks 910-930 of method 900 may correspond to block 810 of method 800 in some embodiments. Although use of a three-by-three portion of the image is disclosed, any suitable number of rows and columns may be used in other embodiments. For example, five-by-five, five-by-seven, one-by-one, and other size image portions are contemplated.

Use of the circuits and methods disclosed herein may enable an in-memory compute circuit to be implemented that performs multiple MAC operations in a few clock cycles, e.g., in four clock cycles as described above. An amount of input values that may be included in these MAC operations may be determined by a number and size of the disclosed routing cycles. Such an in-memory compute circuit may provide a capability to perform such MAC operations more rapidly and/or efficiently as compared to other MAC implementations.

Figure 10:
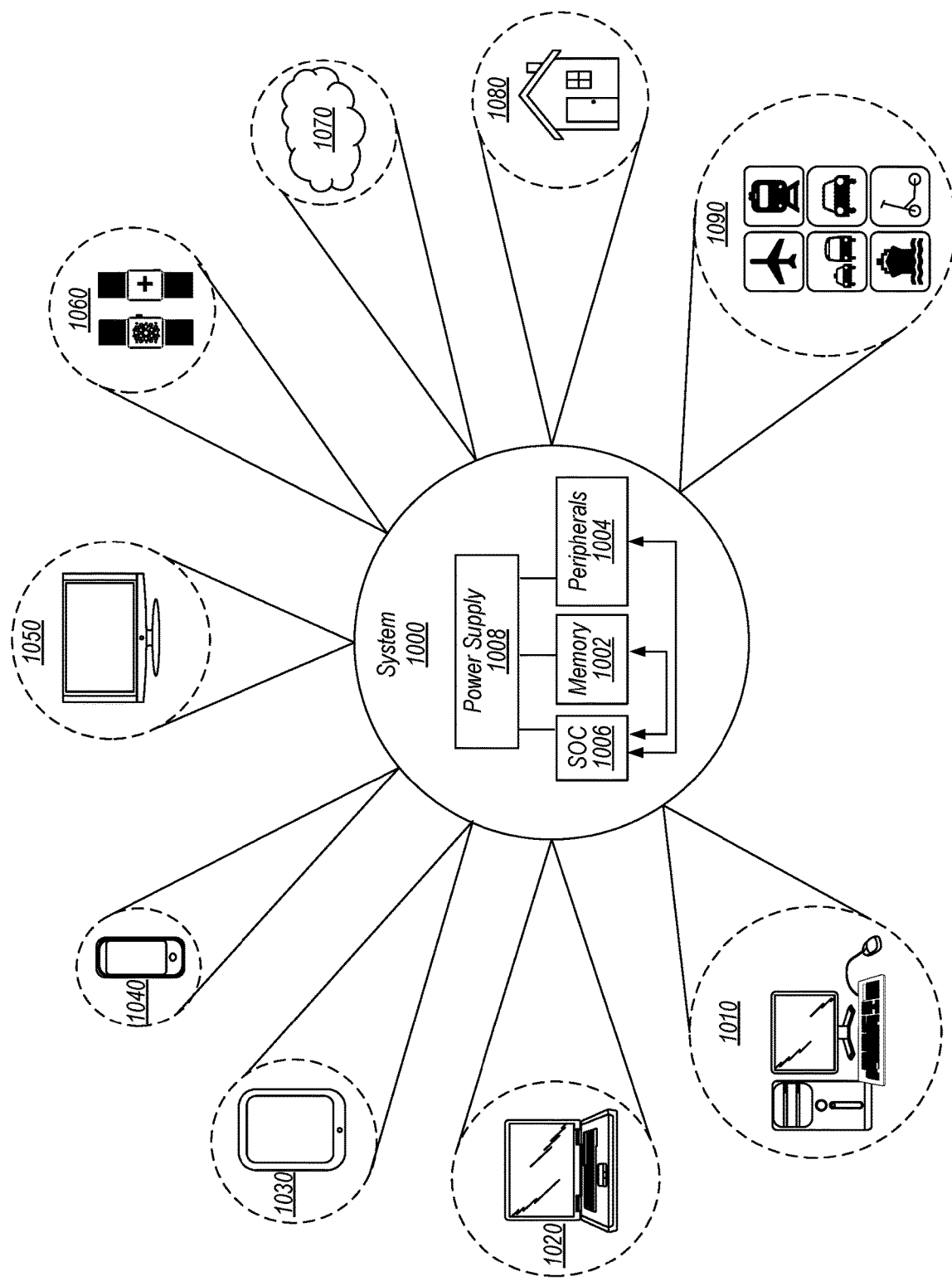
FIG. 10 illustrates various embodiments of systems that include coupled integrated circuits.

FIGS. 1-9 illustrate circuits and methods for a system that includes an in-memory compute circuit for performing MAC operations. Any embodiment of the disclosed systems may be included in one or more of a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 1000 is illustrated in FIG. 10. Computer system 1000 may, in some embodiments, include any disclosed embodiment of system 100 or 200.

In the illustrated embodiment, the system 1000 includes at least one instance of a system on chip (SoC) 1006 which may include multiple types of processing circuits, such as a central processing unit (CPU), a graphics processing unit (GPU), or otherwise, a communication fabric, and interfaces to memories and input/output devices. In some embodiments, one or more processors in SoC 1006 includes multiple execution lanes and an instruction issue queue. In various embodiments, SoC 1006 is coupled to external memory 1002, peripherals 1004, and power supply 1008.

A power supply 1008 is also provided which supplies the supply voltages to SoC 1006 as well as one or more supply voltages to the memory 1002 and/or the peripherals 1004. In various embodiments, power supply 1008 represents a battery (e.g., a rechargeable battery in a smart phone, laptop or tablet computer, or other device). In some embodiments, more than one instance of SoC 1006 is included (and more than one external memory 1002 is included as well).

The memory 1002 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1004 include any desired circuitry, depending on the type of system 1000. For example, in one embodiment, peripherals 1004 includes devices for various types of wireless communication, such as Wi-Fi, Bluetooth, cellular, global positioning system, etc. In some embodiments, the peripherals 1004 also include additional storage, including RAM storage, solid state storage, or disk storage.

The peripherals 1004 include user interface devices such as a display screen, including touch display screens or multi-touch display screens, keyboard or other input devices, microphones, speakers, etc.

As illustrated, system 1000 is shown to have application in a wide range of areas. For example, system 1000 may be utilized as part of the chips, circuitry, components, etc., of a desktop computer 1010, laptop computer 1020, tablet computer 1030, cellular or mobile phone 1040, or television 1050 (or set-top box coupled to a television). Also illustrated is a smartwatch and health monitoring device 1060. In some embodiments, the smartwatch may include a variety of general-purpose computing related functions. For example, the smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices 1070 are contemplated as well, such as devices worn around the neck, devices attached to hats or other headgear, devices that are implantable in the human body, eyeglasses designed to provide an augmented and/or virtual reality experience, and so on.

System 1000 may further be used as part of a cloud-based service(s) 1080. For example, the previously mentioned devices, and/or other devices, may access computing resources in the cloud (i.e., remotely located hardware and/or software resources). Also illustrated in FIG. 10 is the application of system 1000 to various modes of transportation 1090. For example, system 1000 may be used in the control and/or entertainment systems of aircraft, trains, buses, cars for hire, private automobiles, waterborne vessels from private boats to cruise liners, scooters (for rent or owned), and so on. In various cases, system 1000 may be used to provide automated guidance (e.g., self-driving vehicles), general systems control, and otherwise.

It is noted that the wide variety of potential applications for system 1000 may include a variety of performance, cost, and power consumption requirements. Accordingly, a scalable solution enabling use of one or more integrated circuits to provide a suitable combination of performance, cost, and power consumption may be beneficial. These and many other embodiments are possible and are contemplated. It is noted that the devices and applications illustrated in FIG. 10 are illustrative only and are not intended to be limiting. Other devices are possible and are contemplated.

As disclosed in regards to FIG. 10, computer system 1000 may include one or more integrated circuits included within a personal computer, smart phone, tablet computer, or other type of computing device. A process for designing and producing an integrated circuit using design information is presented below in FIG. 11.

Figure 11:
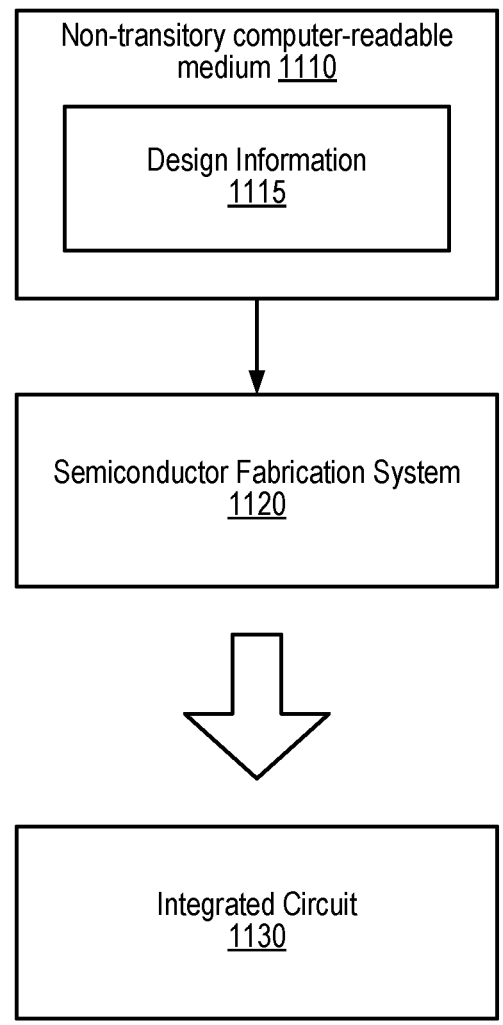
FIG. 11 shows a block diagram of an example computer-readable medium, according to some embodiments.

FIG. 11 is a block diagram illustrating an example of a non-transitory computer-readable storage medium that stores circuit design information, according to some embodiments. The embodiment of FIG. 11 may be utilized in a process to design and manufacture integrated circuits, for example, systems 100 or 200 as shown in FIGS. 1-4. In the illustrated embodiment, semiconductor fabrication system 1120 is configured to process the design information 1115 stored on non-transitory computer-readable storage medium 1110 and fabricate integrated circuit 1130 (e.g., system 100 or 200) based on the design information 1115.

Non-transitory computer-readable storage medium 1110, may comprise any of various appropriate types of memory devices or storage devices. Non-transitory computer-readable storage medium 1110 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated, including the following: Claim 3 (could depend from any of claims 1-2); claim 4 (any preceding claim); claim 5 (claim 4), etc. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
an in-memory compute circuit that includes:
a memory circuit configured to:
generate a set of products by combining received input values with respective weight values stored in rows of the memory circuit, wherein the input values include digital data; and
combine the set of products to generate an accumulated output value;
a plurality of routing circuits, including a first routing circuit coupled to a first set of rows of the memory circuit; and
a control circuit configured to cause:
the first routing circuit to route groups of input values to different ones of the first set of rows over a plurality of clock cycles, including routing a first group of input values to a first subset of the first set of rows in a first clock cycle and routing a second group of input values to a second subset of the first set of rows in a second clock cycle that is subsequent to the first clock cycle; and
the memory circuit to generate, on a clock cycle following the plurality of clock cycles, a particular accumulated output value that is computed based on the routed groups of input values, including the first and second groups of input values.

2. The apparatus of claim 1, wherein the received input values are respective portions of pixel data;
wherein ones of the first group of input values are included in adjacent pixels in a first column of pixels; and
wherein ones of the second group of input values are included in adjacent pixels in a second column of pixels, adjacent to the first column of pixels.

3. The apparatus of claim 1, wherein the control circuit is further configured to route, using a second routing circuit of the plurality of routing circuits, different groups of input values to different ones of a second set of rows over the plurality of clock cycles.

4. The apparatus of claim 1, wherein the first routing circuit includes a plurality of latching circuits, and wherein to route the groups of input values, the first routing circuit is configured, in response to a transition of a clock signal, to shift a first group of input values from a first set of the latching circuits to a second set of the latching circuits, and shift a second group of input values to the first set of the latching circuits.

5. The apparatus of claim 1, wherein the in-memory compute circuit includes a corresponding one of a plurality of digital-to-analog converters (DACs) coupled to a respective row of the rows of the memory circuit; and
wherein to generate and combine a given set of products, the memory circuit is further configured to:
use respective input values to generate particular voltage levels on outputs of the corresponding DACs; and
generate an accumulated voltage level indicative of the accumulated output value using the outputs of the corresponding DACs and a column of memory cells of the memory circuit, wherein memory cells of the column of memory cells store respective weight values.

6. The apparatus of claim 5, wherein the memory circuit includes an analog-to-digital converter (ADC) coupled to the column of memory cells; and
wherein to generate the accumulated output value, the memory circuit is further configured to use the ADC to convert the accumulated voltage level of the column of memory cells to a digital value.

7. The apparatus of claim 1, wherein the control circuit is further configured to use the accumulated output value as one of another group of input values in a subsequent clock cycle.

8. A method comprising:
during a series of clock cycles, routing, by an in-memory compute circuit, a plurality of groups of input values that include digital data to different ones of a set of respective rows of the in-memory compute circuit, wherein the routing includes:
routing a first group of input values to a first subset of the set of respective rows in a first clock cycle; and
routing a second group of input values to a second subset of the set of respective rows in a second clock cycle that is subsequent to the first clock cycle; and
during a subsequent clock cycle following the series of clock cycles:
combining the groups of input values with a set of weight values stored in the set of respective rows to generate a set of products; and
combining the set of products to generate an accumulated output value.

9. The method of claim 8, wherein routing the first group of input values includes routing pixel data corresponding to adjacent pixels in a first column of pixels; and
wherein routing the second group of input values includes routing pixel data corresponding to adjacent pixels in a second column of pixels that are adjacent to the first column of pixels.

10. The method of claim 9, during a third cycle of the series of clock cycles, routing pixel data corresponding to adjacent pixels in a third column of pixels that are adjacent to the second column of pixels, such that a particular portion of an image, including at least a three-pixel by three-pixel portion, is routed to the in-memory compute circuit.

11. The method of claim 10, wherein generating the accumulated output value includes generating the accumulated output value as a convolution of the particular portion of the image.

12. The method of claim 10, further comprising:
routing pixel data of rows of the particular portion of the image to respective subsets of the set of respective rows; and
at a subsequent point in time, routing pixel data of rows of a different portion of the image to respective subsets of the set of the respective rows, wherein one or more rows of pixel data of the different portion of the image include the same pixels as the particular portion of the image.

13. The method of claim 9, wherein routing the pixel data includes routing a plurality of values indicative of different characteristics of a given pixel to respective ones of the set of the respective rows.

14. The method of claim 8, wherein combining the groups of input values with the set of weight values to generate the set of products includes generating a single analog signal for respective products of the set of products.

15. An image processing circuit comprising:
a memory buffer circuit including a plurality of memory ranges that are configured to return a portion of stored data concurrently;
a memory access circuit configured to distribute pixel data of a digitized image among the plurality of memory ranges; and
an in-memory compute circuit, including sets of rows of memory cells, and configured to:
receive a plurality of weight values to be stored in memory cells of at least a portion of the sets of rows;
during a series of clock cycles, route groups of the pixel data to the sets of rows, including:
routing a first group of pixel data to a first subset of the sets of rows in a first clock cycle of the series; and
routing a second group of pixel data to a second subset of the sets of rows in a second clock cycle of the series, subsequent to the first clock cycle; and
during a subsequent clock cycle following the series of clock cycles:
generate a set of products using the groups of the pixel data and the received weight values; and
generate an accumulated output value by combining a subset of the set of products.

16. The image processing circuit of claim 15, wherein the groups of the pixel data include portions of stored pixel data from three or more of the plurality of memory ranges.

17. The image processing circuit of claim 15, wherein ones of the groups of the pixel data correspond to pixel data for respective columns of pixels in a portion of the digitized image; and
wherein to generate the accumulated output value, the in-memory compute circuit is configured to perform a convolution of the portion of the digitized image.

18. The image processing circuit of claim 17, wherein to perform the convolution, the in-memory compute circuit is configured to generate a set of output values, including the accumulated output value, ones of the set of output values indicative of respective characteristics of the portion of the digitized image.

19. The image processing circuit of claim 15, wherein the in-memory compute circuit is further configured, at a subsequent point in time, to route the accumulated output value as an input value to a particular set of the rows of memory cells.

20. The image processing circuit of claim 15, wherein the groups of the pixel data include first, second and third groups routed to first, second, and third sets of rows, respectively; and
wherein the in-memory compute circuit is further configured to:
during a different series of clock cycles, subsequent to the following clock cycle:
shift the second and third groups of the pixel data to the first and second sets of rows, respectively;
route a fourth group of the pixel data to the third set of rows; and
generate a different set of products using the second, third, and fourth groups of the pixel data and the received weight values; and
generate a different accumulated output value by accumulating a subset of the different set of products.

* * * * *